United States Patent
Sakai

(10) Patent No.: US 8,957,426 B2
(45) Date of Patent: Feb. 17, 2015

(54) LAMINATE SUBSTRATE AND METHOD OF FABRICATING THE SAME

(75) Inventor: Shiro Sakai, Tokushima (JP)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 13/985,201

(22) PCT Filed: May 17, 2011

(86) PCT No.: PCT/KR2011/003645
§ 371 (c)(1),
(2), (4) Date: Aug. 13, 2013

(87) PCT Pub. No.: WO2012/111884
PCT Pub. Date: Aug. 23, 2012

(65) Prior Publication Data
US 2013/0313577 A1    Nov. 28, 2013

(30) Foreign Application Priority Data
Feb. 16, 2011    (JP) .................. 2011-030875

(51) Int. Cl.
*H01L 29/15*    (2006.01)
*H01L 21/36*    (2006.01)
*H01L 29/267*    (2006.01)
(Continued)

(52) U.S. Cl.
CPC .......... *H01L 29/267* (2013.01); *H01L 21/0237* (2013.01); *H01L 21/02439* (2013.01); *H01L 21/02458* (2013.01); *H01L 21/02494* (2013.01); *H01L 21/02502* (2013.01); *H01L 21/02505* (2013.01); *H01L 21/0254* (2013.01); *H01L 21/0262* (2013.01); *H01L 33/007* (2013.01); *H01L 33/12* (2013.01);
(Continued)

(58) Field of Classification Search
USPC ................... 257/76, 103, E29.003, E33.024, 257/E21.054, E21.121; 438/478, 479
See application file for complete search history.

(56) References Cited

U.S. PATENT DOCUMENTS 6,242,764 B1    6/2001    Ohba et al.
8,624,291 B2 *  1/2014    Sakai .......................... 257/103
(Continued)

FOREIGN PATENT DOCUMENTS

JP    52-061475    5/1977
JP    11-040893    2/1999
(Continued)

OTHER PUBLICATIONS

International Search Report issued on Feb. 16, 2012 in International Application No. PCT/KR2011/003645.

*Primary Examiner* — Long K Tran
(74) *Attorney, Agent, or Firm* — H.C. Park & Associates, PLC

(57) ABSTRACT

Embodiments of the invention provide a crystalline aluminum carbide layer, a laminate substrate having the crystalline aluminum carbide layer formed thereon, and a method of fabricating the same. The laminate substrate has a GaN layer including a GaN crystal and an AlC layer including an AlC crystal. Further, the method of fabricating the laminate substrate, which has the AlN layer including the AlN crystal and the AlC layer including the AlC crystal, includes supplying a carbon containing gas and an aluminum containing gas to grow the AlC layer.

16 Claims, 6 Drawing Sheets

(51) Int. Cl.
  *H01L 21/02* (2006.01)
  *H01L 33/00* (2010.01)
  *H01L 33/12* (2010.01)
  *H01L 29/16* (2006.01)
  *H01L 33/32* (2010.01)

(52) U.S. Cl.
  CPC ..... *H01L 21/02521* (2013.01); *H01L 29/1608* (2013.01); *H01L 33/32* (2013.01)
  USPC 257/76; 257/103; 257/E29.003; 257/E33.024; 257/E21.054; 257/E21.121; 438/478; 438/479

(56) References Cited

U.S. PATENT DOCUMENTS 8,697,551 B2 * 4/2014 Sakai ........................ 438/478
2002/0056836 A1 5/2002 Sawazaki et al.

FOREIGN PATENT DOCUMENTS

JP  2008-120670  5/2008
WO  2009-072631  6/2009

* cited by examiner

Figure 1
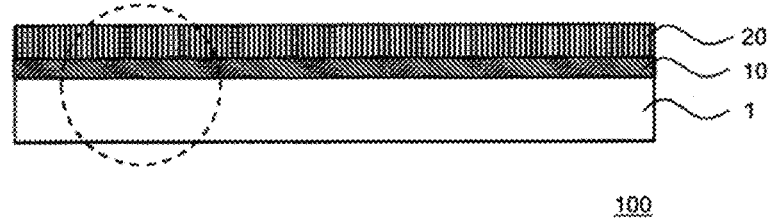
(a)
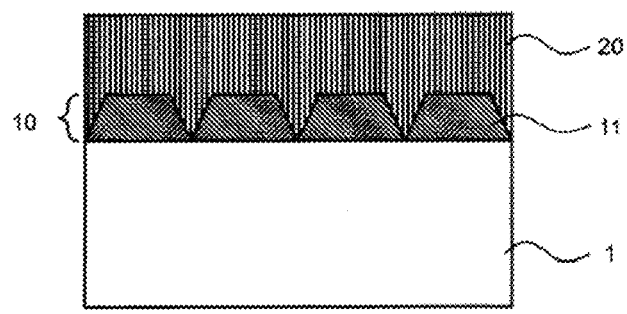
(b)
Figure 2
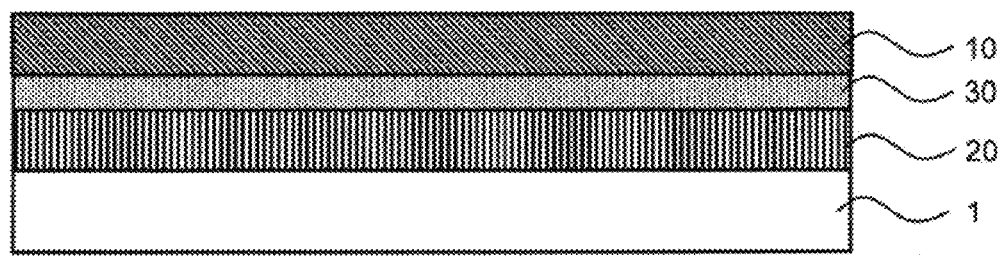

300

400

1000

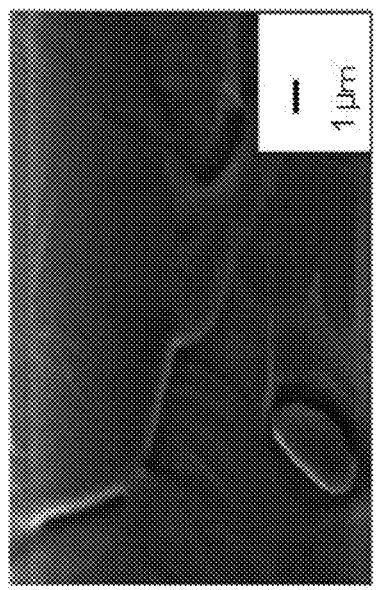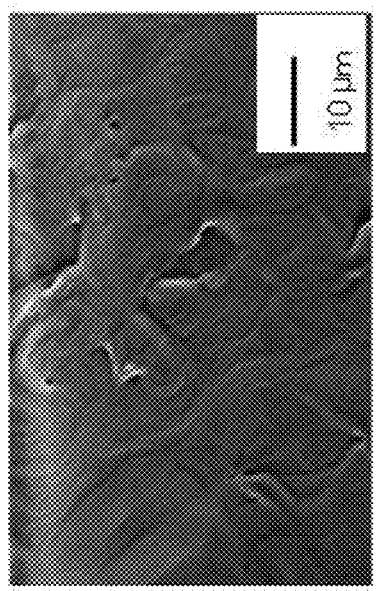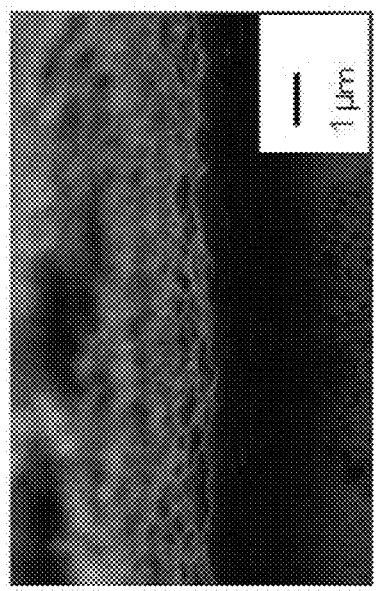
Figure 8

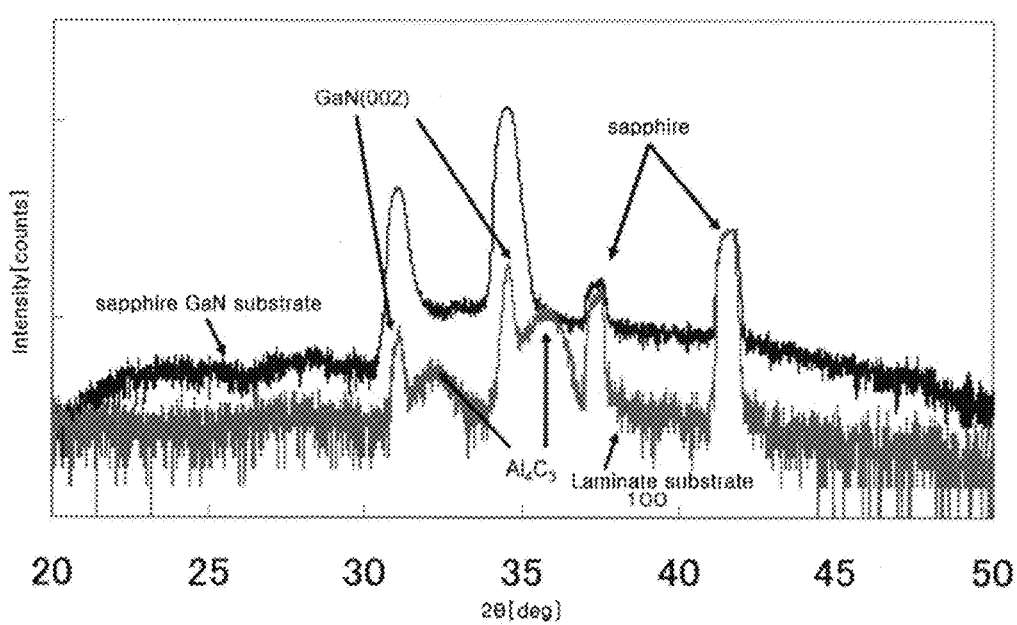

LAMINATE SUBSTRATE AND METHOD OF FABRICATING THE SAME

CROSS-REFERENCE TO RELATED APPLICATIONS

This application is the National Stage entry of International Application PCT/KR2011/003645, filed on May 17, 2011, and claims priority from and the benefit of Japanese Patent Application No. 2011-030875, filed on Feb. 16, 2011, which are incorporated herein by reference for all purposes as if fully set forth herein.

BACKGROUND

1. Field

The present invention relates to a laminate substrate having an aluminum carbide layer and a gallium nitride layer, and a method of fabricating the same. More particularly, the invention relates to a laminate substrate having a crystalline aluminum carbide layer formed thereon and a method of fabricating the same.

2. Discussion of the Background

A light emitting diode (LED) including a gallium nitride (GaN) based semiconductor may be used for various applications, such as signal devices, backlight units for liquid crystal panels, and the like. AlGaInN-based LEDs may have a wavelength band of 260~290 nm or 360~600 nm, and an AlGaN-based active layer may be included to produce a shorter wavelength band (300~340 nm). As such, $Al_xGa_{1-x}N$-based semiconductor materials have been developed. At a wavelength of 280 nm, it is possible to obtain a light extraction efficiency of 10% or more.

However, since AlGaN is liable to split and has a relatively high dislocation density, an AlGaN material used in a wavelength band from 300 nm to 360 nm has not yet been developed. Current reports say that AlGaN-based LEDs exhibit a light extraction efficiency of at most 8%, in a wavelength band of 300~350 nm.

Generally, elements located at an upper part of the periodic table emit light at shorter wavelengths. Although B, N or C has the shortest emission wavelengths, these components are not suited for general light emitting materials, since the growth of these materials requires high temperatures of 2500° C. or more. AlN may be used instead of these materials. Accordingly, investigations have been made to develop a material that emits light at a short wavelength ($\lambda=210$ nm) using AlN. However, AlGaN has low light extraction efficiency, as described above.

Meanwhile, aluminum carbide $Al_4C_3$ (hereinafter, "AlC") is an important compound in aluminum related technology, due to its high electrical resistance and high thermal conductivity at room temperature. Since AlCN, which is an aluminum compound similar to AlC, can be used in various applications such as microelectronics, photonic technology and the like due to its wide band gap, high chemical stability and high hardness, AlC is also anticipated to have the same capabilities as AlCN. AlC is a III-IV group-based material and is generally known as a nano-processing material.

In order to use AlC for a semiconductor substrate, particularly, for LEDs, it is necessary to provide a thin film exhibiting excellent crystallinity. However, crystalline thin films formed using AlC have not yet been developed. Currently, only a non-crystalline thin film of AlC has been reported by L. Yate et al., Surface and Coatings Technology, 203, 1904 (2009).

SUMMARY

In order to use AlC, particularly, for LEDs, a laminate substrate having a stack of an AlC layer and a GaN layer must be provided. However, the laminate substrate having the AlC layer and the GaN layer stacked thereon has not yet been developed due to a difficulty in formation of a crystalline AlC layer.

Exemplary embodiments of the invention provide a laminate substrate having a crystalline aluminum carbide (AlC) layer and a crystalline gallium nitride (GaN) layer, and a method of fabricating the same.

Additional features of the invention will be set forth in the description which follows, and in part will be apparent from the description, or may be learned by practice of the invention.

An exemplary embodiment of the invention provides a laminate substrate, which has a GaN layer including a GaN crystal and an AlC layer including an AlC crystal.

The laminate substrate may further include an AlN layer including an aluminum nitride (AlN) crystal.

For the laminate substrate, the GaN layer, the AlC layer or the AlN layer may be formed on a sapphire substrate, a silicon carbide substrate or an AlN substrate.

For the laminate substrate, the GaN layer, the AlC layer or the AlN layer may be formed on a c-plane of the sapphire substrate.

For the laminate substrate, the GaN layer and the AlC layer may be formed to face each other with the AlN layer interposed therebetween.

An exemplary embodiment of the invention provides a laminate substrate, which has a first AlN layer and a second AlN layer. The first AlN layer and the second AlN layer are formed to face each other with an AlC layer interposed therebetween.

An exemplary embodiment of the invention provides a semiconductor device, which has a GaN layer including a GaN crystal and an AlC layer including an AlC crystal.

The semiconductor device may further include an AlN layer including an AlN crystal.

For the semiconductor device, the GaN layer, the AlC layer or the AlN layer may be formed on a sapphire substrate, a silicon carbide substrate or an AlN substrate.

For the semiconductor device, the GaN layer, the AlC layer or the AlN layer may be formed on a c-plane of the sapphire substrate.

For the semiconductor device, the GaN layer and the AlC layer may be formed to face each other with the AlN layer interposed therebetween.

An exemplary embodiment of the invention provides a semiconductor device, which has a first AlN layer and a second AlN layer. The first AlN layer and the second AlN layer are formed to face each other with an AlC layer interposed therebetween.

An exemplary embodiment of the invention provides a method of fabricating a laminate substrate, which includes a GaN layer including a GaN crystal and an AlC layer including an AlC crystal. The method includes supplying a carbon containing gas and an aluminum containing gas to form the AlC layer by growing an AlC crystal.

The method may further include forming an AlN layer including an AlN crystal.

An exemplary embodiment of the invention provides a method of fabricating a laminate substrate, which includes an AlN layer including an AlN crystal and an AlC layer including an AlC crystal. The method includes supplying a carbon containing gas and an aluminum containing gas to form the AlC layer by growing an AlC crystal.

The AlC crystal may be grown to form the AlC layer using metal organic chemical vapor deposition.

The GaN layer, the AlC layer or the AlN layer may be formed on a sapphire substrate, a silicon carbide substrate or an AlN substrate The AlC crystal may be grown on a c-plane of the sapphire substrate.

The carbon containing gas may be methane and the aluminum containing gas may be tri-methyl aluminum.

The tri-methyl aluminum may be supplied at flow rates of 33 μmol/min to 66 μmol/min and the methane may be supplied at flow rates of 13 mmol/min to 27 mmol/min to grow the AlC crystal.

The AlC crystal may be grown at a temperature of 700° C. or more.

The AlC crystal may be grown at a temperature of 1100° C. or more.

An exemplary embodiment of the invention provides a method of fabricating a semiconductor device, which has a GaN layer including a GaN crystal and an AlC layer including an AlC crystal. The method includes supplying a carbon containing gas and an aluminum containing gas to form the AlC layer by growing an AlC crystal.

The method may further include forming an AlN layer including an AlN crystal.

An exemplary embodiment of the invention provides a method of fabricating a semiconductor device, which includes an AlN layer including an AlN crystal and an AlC layer including an AlC crystal. The method includes supplying a carbon containing gas and an aluminum containing gas to form the AlC layer by growing an AlC crystal.

The AlC crystal may be grown by metal organic chemical vapor deposition.

The GaN layer, the AlC layer or the AlN layer may be formed on a sapphire substrate, a silicon carbide substrate or an AlN substrate The AlC crystal may be grown on a c-plane of the sapphire substrate.

The carbon containing gas may be methane and the aluminum containing gas may be tri-methyl aluminum.

The tri-methyl aluminum may be supplied at flow rates of 33 μmol/min to 66 μmol/min and the methane may be supplied at flow rates of 13 mmol/min to 27 mmol/min to grow the AlC crystal.

The AlC crystal may be grown at a temperature of 700° C. or more.

The AlC crystal may be grown at a temperature of 1100° C. or more.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 1 is a view of a laminate substrate 100 in accordance with one exemplary embodiment of the invention, in which (a) is a side sectional view of the laminate substrate 100 and (b) is a partially enlarged view of a circled portion of the laminate substrate 100.

FIG. 2 is a view of a laminate substrate 200 in accordance with another exemplary embodiment of the invention.

FIG. 8 is scanning electron microscope (SEM) images of the laminate substrate 100 in accordance with the exemplary embodiment of the invention, in which (a) shows an upper surface of the AlC layer 20 of the laminate substrate 100, (b) is an enlarged view of a portion of (a), and (c) is a perspective view of the laminate substrate 100.

FIG. 9 is a graph of an XRD measurement result of the laminate substrate 100 in accordance with the embodiment of the invention.

DETAILED DESCRIPTION OF THE ILLUSTRATED EMBODIMENTS

Figure 3:
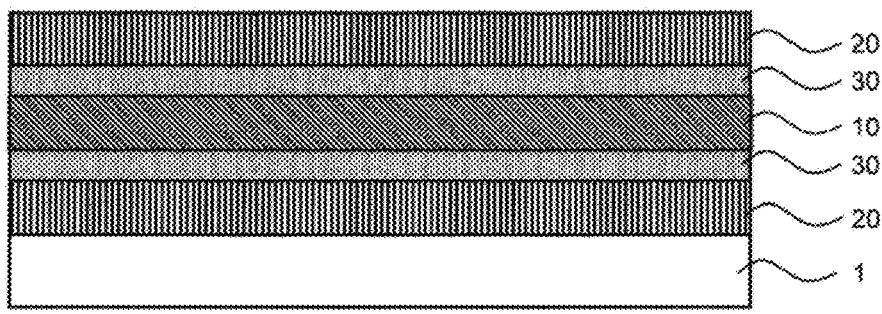
FIG. 3 is a view of a laminate substrate 300 in accordance with a further exemplary embodiment of the invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. In the drawings, the sizes and relative sizes of layers and regions may be exaggerated for clarity. Like elements will be denoted by like reference numerals and repeated descriptions thereof will be omitted herein.

It will be understood that when an element such as a layer, film, region or substrate is referred to as being "on" another element, it can be directly on the other element or intervening elements may also be present. In contrast, when an element is referred to as being "directly on" another element, there are no intervening elements present.

The inventor of the present invention investigated materials, fabrication conditions, and the like to obtain a crystalline aluminum carbide layer (hereinafter, referred to as an "AlC layer") and finally developed a crystalline AlC layer on a c-plane of a sapphire substrate. According to the invention, a laminate substrate is fabricated by forming the crystalline AlC layer on a gallium nitride layer (hereinafter, referred to as a "GaN layer") or on an aluminum nitride layer (hereinafter, referred to as an "AlN layer"), and applied to the field of semiconductors, particularly, to LEDs.

Laminate substrates according to exemplary embodiments may be evaluated using a scanning electron microscope (SEM), X-ray diffraction (XRD), an energy dispersive x-ray spectroscopy (EDX), cathode luminescence (CL), and/or a transmittance measurement.

Embodiment 1

Next, a laminate substrate 100 according to one exemplary embodiment will be described with reference to FIG. 1.

FIG. 1 is a view of the laminate substrate 100 in accordance with the exemplary embodiment of the invention. FIG. 1(a) is a side sectional view of the laminate substrate 100 and FIG. 1(b) is a partially enlarged view of a circled portion of the laminate substrate 100 of FIG. 1(a). The laminate substrate 100 is formed by stacking a crystalline GaN layer 10 and a crystalline AlC layer 20 on a substrate 1. Here, the substrate 1 may be a sapphire substrate, a silicon carbide substrate or an aluminum nitride substrate. When the sapphire substrate is used as the substrate 1, the GaN layer 10 may be formed on the c-plane of the sapphire substrate 1.

In the laminate substrate 100, the GaN layer 10 preferably has a thickness of 0.5 um or less, and more preferably 0.1 um or less. If the thickness of the GaN layer 10 is 0.1 um or less, GaN crystals 11 are dispersed in a dot shape on the substrate 1.

Since $Al_4C_3$ generally has a yellow color, it can be observed with the naked eye or an optical microscope that the color of the substrate is changed to a yellow color when the AlC layer 20 is formed on the GaN layer 10. Further, using a SEM, it can be seen that crystals are grown on the GaN layer 10. Through an SEM image of a side section of the laminate substrate, the AlC layer 20 is shown to be formed on the substrate 1.

The laminate substrate 100 has a peak near 35° in 2θ-ω mode of XRD, which is caused by $Al_4C_3$ crystals. Further, peaks caused by the substrate 1 and the GaN layer 10 are also detected in addition to the peaks caused by the $Al_4C_3$ crystals. For example, when the GaN layer 10 and the AlC layer 20 are formed on the c-plane of the sapphire substrate 1, peaks near 38° and 42° caused by the sapphire substrate and peaks near 31° and 34° caused by the GaN are also detected.

An EDX image shows the presence of aluminum and carbon in the AlC layer 20 on the laminate substrate 100. In the EDX image showing the presence of aluminum and carbon, since the AlC layer 20 is crystalline, aluminum and carbon are detected in a dispersed state. The aluminum and carbon may be uniformly dispersed in the AlC layer 20.

In a CL measurement, the laminate substrate 100 emits light in the wavelength range of from 310 nm to 413 nm, as a result of the $Al_4C_3$ crystals of the AlC layer 20. The AlC layer 20 has a peak near 340 nm and exhibits light extraction in a wavelength band of 300~350 nm, when used in an LED.

In a transmittance measurement, the AlC layer 20 has a band gap of from 3.4 to 4.3 eV. Further, the AlC layer 20 has a direct transition in the region of the band gap, that is, in a luminescence energy region. Here, the direct transition refers to a state that the square of the transmittance ratio is proportional to energy, in a plot of values obtained by dividing the transmittance ratio of the $Al_4C_3$/substrate by the transmittance ratio of the substrate with respect to the energy. Further, the AlC layer 20 may be adjusted to have an indirect band gap by adjusting a fabrication temperature thereof.

As described above, although only a non-crystalline AlC thin film has been reported in the art, the present laminate substrate 100 may allow a crystalline AlC layer 20 to be formed on the GaN layer 10. Further, when used in an LED, the laminate substrate 100 exhibits light extraction in the wavelength band of 300~350 nm.

(Fabrication Method)

Next, a method of fabricating the laminate substrate 100 according to this exemplary embodiment will be described. In fabrication of the laminate substrate, in particular, in formation of the AlC layer 20, metal organic vapor deposition (MOCVD) may be used. In this embodiment, the AlC layer 20 is grown on the surface of the GaN layer 10.

As described above, the substrate 1 may be any type of substrate which can be used for crystal growth of semiconductors, particularly, LEDs. For example, the substrate 1 may be a sapphire substrate, a silicon carbide substrate or an aluminum nitride substrate. When the sapphire substrate is used as the substrate 1, the GaN layer or the AlC layer 20 may be formed on the c-plane of the sapphire substrate 1.

(Formation of GaN Layer)

Raw materials for the GaN layer 10 to be formed on the substrate 1 include a nitrogen containing gas and a gallium containing gas. The nitrogen containing gas may be ammonia ($NH_3$) and the gallium containing gas may be tri-methyl gallium ($Ga(CH_3)_3$; hereinafter "TMG"). Further, hydrogen ($H_2$) may be used as a carrier gas. The respective raw materials may be commercially available materials used in the field of semiconductors, particularly, in the field of LEDs.

According to this embodiment, as conditions for growing GaN crystals for the GaN layer 10, TMG may be supplied to a fabrication atmosphere at flow rates of 10 μmol/min to 100 μmol/min, and the ammonia may be supplied at flow rates of 40 mmol/min to 1 mmol/min. Further, the GaN crystals are grown at a temperature of 900~1100° C. The GaN layer 10 preferably has a thickness of 0.5 um or less, and more preferably 0.1 um or less. If the thickness of the GaN layer 10 is thicker than this range, dislocations in the GaN crystals 11 increase, causing carbon of the raw gas to be diffused into the GaN layer through the dislocations of the GaN crystals.

In fabrication of the laminate substrate 100, the AlC layer 20 is formed on the GaN layer 10, which is formed on the substrate 1. Here, TMG and the ammonia may be supplied to the fabrication atmosphere until the temperature reaches a growth temperature for AlC crystals. As such, when TMG and ammonia are supplied while increasing the temperature, it is possible to prevent separation of nitrogen from the GaN layer 10.

(Formation of AlC Layer)

Raw materials for the AlC layer 20 include a carbon containing gas and an aluminum containing gas. The carbon containing gas may be methane ($CH_4$) and the aluminum containing gas may be tri-methyl aluminum (($CH_3)_3Al$; hereinafter "TMA").

Further, hydrogen ($H_2$) may be used as a carrier gas. The respective raw materials may be commercially available materials used in the field of semiconductors, particularly, in the field of LEDs.

TMA may be supplied at flow rates of from 33 μmol/min to 66 μmol/min and the methane may be supplied at flow rates of 13 mmol/min to 27 mmol/min, to grow the AlC layer. Further, the AlC crystals are grown at a temperature of 700° C. or more, or at a temperature of 1100° C. or more. Although time for growing the AlC crystals depends on the flow rate of raw materials and/or the thickness of the AlC layer 20, the time for growing the AlC crystals may be in the range of, for example, 60~120 minutes.

As described above, although a non-crystalline AlC thin film has been reported in the art, the laminate substrate 100 allows a crystalline AlC layer to be formed on a substrate by the method described above. Further, the laminate substrate 100 may allow the crystalline AlC layer to be formed on a GaN layer. Accordingly, the laminate substrate 100 may demonstrate the characteristics of the AlC layer described above. Further, when used in an LED, the laminate substrate exhibits light extraction in the wavelength band of 300~350 nm.

Embodiment 2

As described above in Embodiment 1, when an AlC layer is formed at a high temperature of 1000° C. or more, it can be observed that carbon of the raw gas diffuses into the GaN layer. The inventor of the present invention found that a laminate substrate 200 can be formed when an aluminum nitride layer 30 is formed to a thickness of, for example, 20 nm on an AlC layer 20 and a GaN layer 10 is formed to a thickness of 1 um or less on the aluminum nitride layer 30. In this embodiment, a crystalline aluminum nitride layer 30 (hereinafter, referred to as an "AlN layer") is formed between the GaN layer 10 and the AlC layer 20 to prevent diffusion of carbon into the GaN layer.

FIG. 2 is a view of the laminate substrate 200 in accordance with this exemplary embodiment of the invention. The laminate substrate 200 is formed by sequentially stacking a crystalline AlC layer 20, a crystalline AlN layer 30, and a crystalline GaN layer 10 on a substrate 1.

First, the principle of fabricating the laminate substrate 200 according to this embodiment will be described. In formation of the AlC layer 20, AlC crystals are grown at a temperature of 1200° C., in formation of the GaN layer 10, GaN crystals are grown at a temperature of 1050° C., and in formation of the AlN layer 30, AlN crystals are grown at a temperature of 1300° C. At a temperature of 1000° C. or more, since carbon has a two-dimensional electron configuration of $SP^2$ and $\pi$ electrons, carbon is likely to diffuse into the GaN layer 10. The GaN crystals are grown at a temperature of 1050° C., which is lower than the growth temperature of the AlC crystals. Accordingly, C—N bonding occurs at an interface between the AlC layer 20 and the GaN layer 10. However, since carbon tends to have an electron configuration of $SP^2$ and $\pi$ electrons rather than an electron configuration of $SP^3$, carbon is likely to have a two-dimensional electron configuration. Meanwhile, the AlN crystals are grown at a high temperature of 1300° C. and nitrogen in the AlN crystals is stable. As a result, carbon of the raw gas does not easily diffuse into the AlN crystals during formation of the AlC layer 20.

Since $Al_4C_3$ generally has a yellow color, it can be observed with the naked eye or an optical microscope that the color of the substrate is changed to a yellow color when the AlC layer 20 is formed on the AlN layer 30. Further, using a SEM, it can be seen that crystals are grown on the AlN layer 30. Through an SEM image of a side section of the laminate substrate, the AlC layer 20 is shown to be formed on the substrate.

The laminate substrate 200 has a peak near 35° in 2θ-ω mode of XRD, which is caused by $Al_4C_3$ crystals of the AlC layer 20. Further, for the laminate substrate 200 according to the embodiment, peaks caused by the substrate 1 and the GaN layer 10 are also detected in addition to the peaks caused by the $Al_4C_3$ crystals. For example, when the GaN layer 10, the AlN layer 30 and the AlC layer 20 are formed on the c-plane of the sapphire substrate 1, peaks near 38° and 42° caused by the sapphire substrate and peaks near 31° and 34° caused by the GaN are also detected.

An EDX image shows the presence of aluminum and carbon in the AlC layer 20 on the laminate substrate 200 according to the embodiment. In the EDX image showing the presence of aluminum and carbon, since the AlC layer 20 is crystalline, aluminum and carbon are detected in a dispersed state. In this embodiment, aluminum and carbon may be uniformly dispersed in the AlC layer 20.

In a CL measurement, the laminate substrate 200 emits light in the wavelength range of from 310 nm to 413 nm caused by the $Al_4C_3$ crystals of the AlC layer 20. The AlC layer 20 has a peak near 340 nm and exhibits light extraction in the wavelength band of 300 nm to 350 nm when used in an LED.

In a transmittance measurement, the AlC layer 20 according to the embodiment has a band gap of from 3.4 eV to 4.3 eV. Further, the AlC layer 20 is of a direct transition in the region of the band gap, that is, in a luminescence energy region. Here, the direct transition refers to a state that the square of the transmittance ratio is proportional to energy in a plot of values obtained by dividing the transmittance ratio of the $Al_4C_3$/substrate by the transmittance ratio of the substrate with respect to the energy. Further, the AlC layer 20 may be adjusted to have an indirect type band gap by controlling fabrication temperature.

As described above, although a non-crystalline AlC thin film has been reported in the art, the crystalline AlN layer 30 is formed between the GaN layer 10 and the AlC layer 20 in the laminate substrate 200 and has the properties as described above in Embodiment 1. Further, when used in an LED, the laminate substrate 200 exhibits light extraction of light in the wavelength band of 300 nm to 350 nm.

(Fabrication Method)

Next, a method of fabricating the laminate substrate 200 will be described. In fabrication of the laminate substrate 200, metal organic chemical vapor deposition (MOCVD) may be used. In this embodiment, a substrate 1, an AlC layer 20, an AlN layer 30 and a GaN layer 10 are sequentially stacked. As described above, the substrate 1 may be any type of substrate which can be used for crystal growth of semiconductors, particularly, LEDs, and, since the substrate 1 of this embodiment is the same as in Embodiment 1, a detailed description thereof will be omitted herein.

(Formation of AlC Layer)

Raw materials for the AlC layer 20 to be formed on the substrate 1 may include a carbon containing gas and an aluminum containing gas. In this embodiment, the carbon containing gas may be methane and the aluminum containing gas may be TMA as in Embodiment 1. Further, hydrogen ($H_2$) may be used as a carrier gas. The respective raw materials may be commercially available materials used in the field of semiconductors, particularly, in the field of LEDs. According to this embodiment, as conditions for growing the AlC layer 20, TMA may be may be supplied at flow rates of 33 μmol/min to 66 μmol/min and the methane may be supplied at flow rates of 13 mmol/min to 27 mmol/min to grow the AlC crystals. Further, the AlC crystals may be grown at a temperature of 700° C. or more, or at a temperature of 1100° C. or more. Although time for growing the AlC crystals depends on the flow rate of raw material and/or the thickness of the AlC layer 20, the time for growing the AlC crystals may be in the range of, for example, 60~120 minutes.

(Formation of AlN Layer)

Raw materials for the AlN layer 30 include a nitrogen containing gas and an aluminum containing gas. The nitrogen containing gas may be ammonia ($NH_3$) and the aluminum containing gas may be TMA. Further, hydrogen ($H_2$) may be used as a carrier gas. The respective raw materials may be commercially available materials used in the field of semiconductors, particularly, in the field of LEDs.

According to this embodiment, as conditions for growing the AlN layer 30, TMA may be supplied at flow rates of 33 μmol/min to 66 μmol/min, and the ammonia may be supplied at flow rates of 40 mmol/min to 1 mmol/min. Further, AlN crystals for the AlN layer are grown at a temperature of 1300° C. or more. Although time for growing the AlN crystals depends on the flow rate of raw material and/or the thickness of the AlN layer 30, the time for growing the AlC crystals may be in the range of, for example, 6 seconds~1 hour.

(Formation of GaN Layer)

Raw materials for the GaN layer 10 include a nitrogen containing gas and a gallium containing gas. In this embodiment, the nitrogen containing gas may be ammonia and the gallium containing gas may be TMG. Further, hydrogen ($H_2$) may be used as a carrier gas. The respective raw materials may be commercially available materials used in the field of semiconductors, particularly, in the field of LEDs. According to this embodiment, as conditions for growing GaN crystals for the GaN layer 10, TMG may be supplied at flow rates of 20 µmol/min to 80 µmol/min, and the ammonia may be supplied at flow rates of 40 mmol/min to 1 mmol/min. Further, the GaN crystals are grown at a temperature of 900~1100° C. In the method of fabricating the laminate substrate 200, the GaN layer 10 may have a thickness of 1 um or less, or 0.1 um or less.

As described above, although a non-crystalline AlC thin film has been reported in the art, the laminate substrate 200 has a crystalline AlC layer formed on a substrate by the method described above. Further, the laminate substrate 200 may allow the crystalline AlC layer to be formed between an AlC layer and a GaN layer, thereby preventing diffusion of carbon into the GaN layer. Accordingly, it is possible to realize a laminate substrate having an AlC layer, which demonstrates the characteristics described above. Further, when used in an LED, the laminate substrate exhibits light extraction in the wavelength band of 300 nm to 350 nm.

Embodiment 3

In Embodiment 2, the laminate substrate 200 includes the AlN layer formed between the AlC layer and the GaN layer to prevent diffusion of carbon into the GaN layer. In this embodiment, however, a laminate substrate 300 includes an AlN layer and an AlC layer on the laminate substrate 200. FIG. 3 is a view of the laminate substrate 300 according to this embodiment. The laminate substrate 300 is formed by sequentially stacking a crystalline AlC layer 20, a crystalline AlN layer 30, a crystalline GaN layer 10, a crystalline AlN layer 30 and a crystalline AlC layer 20 on a substrate 1. In this embodiment, the substrate 1 is the same as in Embodiment 1, and a detailed description thereof will thus be omitted herein.

For fabricating the laminate substrate 300, the GaN layer 10 is formed by growing GaN crystals at a temperature of 1050° C., and the AlN layer 30 is formed by growing AlN crystals at a temperature of 1300° C. Then, the AlC layer 20 is formed on the AlN layer 30 by growing AlC crystals at a temperature of 1200° C., thereby forming the laminate substrate 300. Since nitrogen is stable in the AlN crystals, carbon of the raw gas for the AlC layer 20 does not diffuse into the AlN layer 30 and the GaN layer 10 during fabrication of the laminate substrate 300.

Since $Al_4C_3$ generally has a yellow color, it can be observed with the naked eye or an optical microscope that the color of the substrate is changed to a yellow color when the AlC layer 20 is formed on the substrate 1 or the AlN layer 30. Further, using a SEM, it can be seen that crystals are grown on the substrate 1 or the AlN layer 30. Through an SEM image of a side section of the laminate substrate, the AlC layer 20 is shown to be formed on the substrate.

The laminate substrate 300 has a peak near 35° in 2θ-ω mode of XRD, which is caused by $Al_4C_3$ crystals of the AlC layer 20. Further, for the laminate substrate 300, peaks caused by the substrate 1 and the GaN layer 10 are also detected in addition to the peaks caused by the $Al_4C_3$ crystals. For example, when the AlC layer 20, the AlN layer 30, the GaN layer 10, the AlN layer 30 and the AlC layer 20 are formed on the c-plane of the sapphire substrate 1, peaks near 38° and 42° caused by the sapphire substrate and peaks near 31° and 34° caused by the GaN are also detected.

An EDX image shows the presence of aluminum and carbon in the AlC layer 20 on the laminate substrate 300. In the EDX image showing the presence of aluminum and carbon, since the AlC layer 20 is crystalline, aluminum and carbon are detected in a dispersed state. In this embodiment, aluminum and carbon may be uniformly dispersed in the AlC layer 20.

In a CL measurement, the laminate substrate 300 emits light in the wavelength range of from 310 nm to 413 nm caused by the $Al_4C_3$ crystals of the AlC layer 20. The AlC layer 20 has a peak near 340 nm and allows light extraction in the wavelength band of 300 nm to 350 nm, when used in an LED.

In a transmittance measurement, the AlC layer 20 has a band gap of from 3.4 eV to 4.3 eV. Further, the AlC layer 20 is a direct transition in the region of the band gap, that is, in a luminescence energy region. Here, the direct transition refers to a state that the square of the transmittance ratio is proportional to energy in a plot of values obtained by dividing the transmittance ratio of the $Al_4C_3$/substrate by the transmittance ratio of the substrate with respect to the energy. Further, the AlC layer 20 may be adjusted to have an indirect band gap by adjusting fabrication temperature.

As described above, although a non-crystalline AlC thin film has been reported in the art, the crystalline AlN layer 30 is formed between the GaN layer 10 and the AlC layer 20 in the laminate substrate 300 and has the properties as described above in Embodiment 1. Further, when used in an LED, the laminate substrate 300 exhibits light extraction in the wavelength band of 300 nm to 350 nm.

(Fabrication Method)

Next, a method of fabricating the laminate substrate 300 will be described. In fabrication of the laminate substrate 300, metal organic vapor deposition (MOCVD) may be used. In this embodiment, a substrate 1, a first AlC layer 20, a first AlN layer 30, a GaN layer 10, a second AlN layer 30, and a second AlC layer 20 are sequentially stacked. As described above, the substrate 1 may be any type of substrate which can be used for crystal growth of semiconductors, particularly, LEDs, and, since the substrate 1 of this embodiment is the same as in Embodiment 1, a detailed description thereof will be omitted herein.

(Formation of First AlC Layer)

Raw materials for the first AlC layer 20 to be formed on the substrate 1 may include a carbon containing gas and an aluminum containing gas. In this embodiment, the carbon containing gas may be methane and the aluminum containing gas may be TMA as in Embodiment 1. Further, hydrogen ($H_2$) may be used as a carrier gas. The respective raw materials may be commercially available materials used in the field of semiconductors, particularly, in the field of LEDs. According to this embodiment, as conditions for growing the AlC layer 20, TMA may be may be supplied at flow rates of 33 µmol/min to 66 µmol/min, and the methane may be supplied at flow rates of 13 mmol/min to 27 mmol/min to grow the AlC crystals. Further, the AlC crystals may be grown at a temperature of 700° C. or more, or at a temperature of 1100° C. or more. Although time for growing the AlC crystals depends on the flow rate of raw material and/or the thickness of the AlC layer 20, the time for growing the AlC crystals may be in the range of, for example, 60~120 minutes.

(Formation of First AlN Layer)

Raw materials for the first AlN layer 30 include a nitrogen containing gas and an aluminum containing gas. The nitrogen containing gas may be ammonia ($NH_3$) and the aluminum containing gas may be TMA. Further, hydrogen ($H_2$) may be used as a carrier gas. The respective raw materials may be commercially available materials used in the field of semiconductors, particularly, in the field of LEDs.

According to this embodiment, as conditions for growing the AlN layer 30, TMA may be supplied at flow rates of 33 µmol/min to 66 µmol/min, and the ammonia may be supplied at flow rates of 40 mmol/min to 1 mmol/min. Further, AlN crystals for the AlN layer are grown at a temperature of 1300°

C. or more. Although time for growing the AlN crystals depends on the flow rate of raw material or the thickness of the AlN layer 30, the time for growing the AlC crystals may be in the range of, for example, 6 seconds~1 hour.

(Formation of GaN Layer)

Raw materials for the GaN layer 10 include a nitrogen containing gas and a gallium containing gas. In this embodiment, the nitrogen containing gas may be ammonia and the gallium containing gas may be TMG. Further, hydrogen ($H_2$) may be used as a carrier gas. The respective raw materials may be commercially available materials used in the field of semiconductors, particularly, in the field of LEDs. According to this embodiment, as conditions for growing GaN crystals for the GaN layer 10, TMG may be supplied at flow rates of 20 μmol/min to 80 μmol/min, and the ammonia may be supplied at flow rates of 40 mmol/min to 1 mmol/min. Further, the GaN crystals are grown at a temperature of 500~1050° C. In the method of fabricating the laminate substrate 300, the GaN layer 10 preferably has a thickness of 1 um or less, or 0.1 um or less.

(Formation of Second AlC Layer and Second AlN Layer)

Since the processes of forming the second AlN layer 30 and the second AlC layer 20 are the same as those of the first AlN layer 30 and the first AlN layer 20, a description thereof will be omitted herein.

As described above, although only a non-crystalline AlC thin film has been reported in the art, the laminate substrate 300 allows a crystalline AlC layer to be formed on a substrate by the method described above. Further, the laminate substrate 300 may have the crystalline AlC layer formed between an AlC layer and a GaN layer, thereby preventing diffusion of carbon into the GaN layer. Accordingly, it is possible to realize a laminate substrate having an AlC layer, which demonstrates the characteristics described above. Further, when used in an LED, the laminate substrate according to the embodiment exhibits light extraction in the wavelength band of 300 nm to 350 nm.

Embodiment 4

Figure 4:
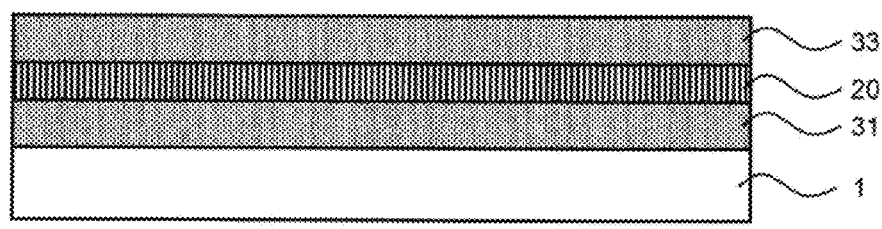
FIG. 4 is a view of a laminate substrate 400 in accordance with yet another exemplary embodiment of the invention.

In the above embodiments, the laminate substrate includes the GaN layer 10. In this embodiment, however, a laminate substrate 400 includes a first AlN layer and a second AlN layer facing each other with an AlC layer interposed therebetween. FIG. 4 is a view of the laminate substrate 400 according to this embodiment. The laminate substrate 400 is formed by sequentially stacking a crystalline AlN layer 31, a crystalline AlC layer 20, and a crystalline AlN layer 33 on a substrate 1. In this embodiment, the substrate 1 is the same as in Embodiment 1, and a detailed description thereof will thus be omitted herein.

For fabricating the laminate substrate 400, for example, silicon (Si) is doped into the first AlN layer 31 formed on the substrate and, for example, magnesium (Mg) is doped into the second AlN layer 33 formed on the AlC layer 20. As a result, the first AlN layer 31 may act as an n-type semiconductor and the second AlN layer 33 may act as a p-type semiconductor.

Since $Al_4C_3$ generally has a yellow color, it can be observed with the naked eye or an optical microscope that the color of the substrate is changed to a yellow color when the AlC layer 20 is formed on the AlN layer 31. Further, using a SEM, it can be seen that crystals are grown on the AlN layer 31. Through an SEM image of a side section of the laminate substrate, the AlC layer 20 is shown to be formed on the substrate.

The laminate substrate 400 has a peak near 35° in 2θ-ω mode of XRD, which is caused by $Al_4C_3$ crystals of the AlC layer 20. Further, for the laminate substrate 400, peaks caused by the substrate 1 are also detected in addition to the peaks caused by the $Al_4C_3$ crystals. For example, when the AlN layer 31, the crystalline AlC layer 20 and the crystalline AlN layer 33 are formed on the c-plane of the sapphire substrate 1, peaks near 38° and 42° caused by the sapphire substrate and peaks near 31° and 34° caused by the GaN are also detected.

An EDX image shows the presence of aluminum and carbon in the AlC layer 20 on the laminate substrate 400. In the EDX image showing the presence of aluminum and carbon, since the AlC layer is crystalline, aluminum and carbon are detected in a dispersed state. In this embodiment, aluminum and carbon may be uniformly dispersed in the AlC layer 20.

In a CL measurement, the laminate substrate 400 emits light in the wavelength range of from 310 nm to 413 nm, which is caused by the $Al_4C_3$ crystals of the AlC layer 20. The AlC layer 20 has a peak near 340 nm and exhibits light extraction in the wavelength band of 300~350 nm, when used in an LED.

In a transmittance measurement, the AlC layer 20 has a band gap of from 3.4~4.3 eV. Further, the AlC layer 20 is a direct transition in the region of the band gap, that is, in a luminescence energy region. Here, the direct transition type refers to a state that the square of the transmittance ratio is proportional to energy in a plot of values obtained by dividing the transmittance ratio of the $Al_4C_3$/substrate by the transmittance ratio of the substrate with respect to the energy. Further, the AlC layer 20 may be adjusted to have an indirect band gap by adjusting fabrication temperature.

As described above, although a non-crystalline AlC thin film has been reported in the art, the AlC layer 20 of the laminate substrate 400 has the crystalline properties as described above in Embodiment 1. Further, when used in an LED, the laminate substrate 400 including the AlC layer 20 formed between the first AlN layer 31 acting as an n-type semiconductor and the second AlN layer 33 acting as a p-type semiconductor exhibits light extraction of light in the wavelength band of around 310 nm.

(Fabrication Method)

Next, a method of fabricating the laminate substrate 400 will be described. In fabrication of the laminate substrate 400, metal organic chemical vapor deposition (MOCVD) may be used. In this embodiment, a substrate 1, a first AlN layer 31, an AlC layer 20 and a second AlN layer 33 are sequentially stacked. As described above, the substrate 1 may be any type of substrate which can be used for crystal growth of semiconductors, particularly, LEDs, and, since the substrate 1 of this embodiment is the same as in Embodiment 1, a detailed description thereof will be omitted herein.

(Formation of First AlN Layer)

Raw materials for the first AlN layer 31 to be formed on the substrate 1 include a nitrogen containing gas and an aluminum containing gas. The nitrogen containing gas may be ammonia ($NH_3$) and the aluminum containing gas may be TMA. Further, hydrogen ($H_2$) may be used as a carrier gas. The respective raw materials may be commercially available materials used in the field of semiconductors, particularly, in the field of LEDs.

According to this embodiment, as conditions for growing the AlN layer 31, TMA may be supplied at flow rates of 33 μmol/min to 66 μmol/min, and the ammonia may be supplied at flow rates of 40 mmol/min to 1 mmol/min. Further, AlN crystals for the AlN layer are grown at a temperature of 1300° C. or more. Although time for growing the AlN crystals depends on the flow rate of raw material or the thickness of the AlN layer 31, the time for growing the AlC crystals may be in the range of, for example, 6 seconds~1 hour. Further, silicon is doped into the AlN layer 31. Here, silicon doping may be carried out by any know process known in the art.

(Formation of AlC Layer)

Raw materials for the first AlC layer 20 may include a carbon containing gas and an aluminum containing gas. In this embodiment, the carbon containing gas may be methane and the aluminum containing gas may be TMA as in Embodiment 1. Further, hydrogen ($H_2$) may be used as a carrier gas. The respective raw materials may be commercially available materials used in the field of semiconductors, particularly, in the field of LEDs. According to this embodiment, as conditions for growing the AlC layer 20, TMA may be supplied at flow rates of 33 μmol/min to 66 μmol/min and the methane may be supplied at flow rates of 13 mmol/min to 27 mmol/min to grow the AlC crystals. Further, the AlC crystals may be grown at a temperature of 700° C. or more, or at a temperature of 1100° C. or more.

Although time for growing the AlC crystals depends on the flow rate of raw material and/or the thickness of the AlC layer 20, the time for growing the AlC crystals may be in the range of, for example, 60~120 minutes.

(Formation of Second AlN Layer)

Since the process of forming the second AlN layer 33 is the same as that of the first AlN layer, a description thereof will be omitted herein. In this embodiment, magnesium is doped into the AlN layer 33. Here, magnesium doping may be carried out by any process known in the art.

As described above, although an AlC thin film has been reported for a non-crystalline thin film in the art, the AlC layer 20 of the laminate substrate 400 according to this embodiment has the crystalline properties as described in Embodiment 1. Further, when used in an LED, the laminate substrate 400 including the AlC layer 20 formed between the first AlN layer 31 acting as an n-type semiconductor and the second AlN layer 33 acting as a p-type semiconductor according to the embodiment exhibits light extraction in the wavelength band of around 310 nm.

Embodiment 5

In the above embodiments, the laminate substrate includes the crystalline AlC layer. As described above, when used in an LED, the laminate substrate exhibits light extraction in the wavelength band of 300~350 nm. In this embodiment, the laminate substrate 300 is applied to a semiconductor device, particularly, to an LED.

Figure 5:
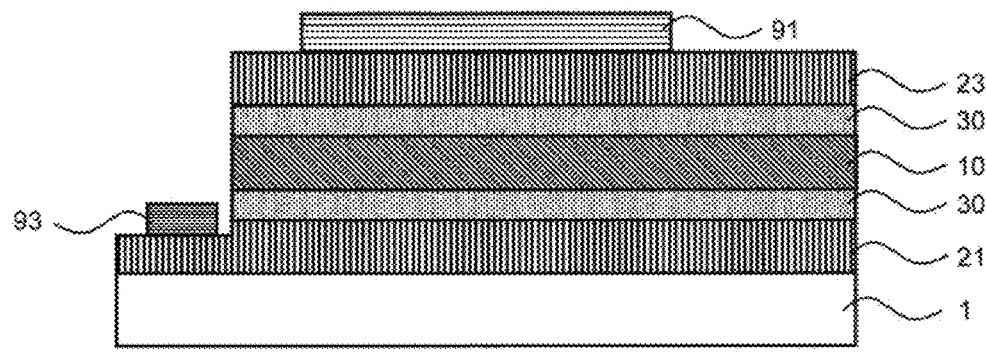
FIG. 5 is a view of a semiconductor device 1000 in accordance with one exemplary embodiment of the invention.

FIG. 5 is a view of a semiconductor device 1000 in accordance with one exemplary embodiment of the invention. The semiconductor device 1000 has a laminate substrate, which is formed by sequentially stacking a substrate 1, a first n-type crystalline AlC layer 21, a first crystalline AlN layer 30, a crystalline GaN active layer 10, a second crystalline AlN layer 30, and a second p-type crystalline AlC layer 23. Further, the semiconductor device 1000 includes a P-electrode 91 and an N-electrode 93, in which the P-electrode 91 is located on an upper surface of the second p-type AlC layer 20 and the N-electrode 93 is located on an upper surface of the first n-type AlC layer 21.

In the semiconductor device 1000, for example, silicon (Si) is doped into the first AlC layer 21 formed on the substrate 1, and, for example, zinc (Zn) or magnesium (Mg) is doped into the second AlC layer 23 formed on the second AlN layer 30. As a result, the first AlC layer 21 may act as an n-type semiconductor and the second AlC layer 23 may act as a p-type semiconductor. In addition, since the semiconductor device 1000 according to this embodiment includes the laminate substrate 300 of Embodiment 3, the configuration and characteristics of the laminate substrate for this embodiment will be omitted herein.

(Electrode)

The electrodes of the semiconductor device will be described. In this embodiment, the P-electrode 91 may be an Au/Ni electrode pad, which is formed by sequentially stacking, for example, nickel and gold on the second p-type AlC layer 20. Further, the N-electrode 93 may be an Al/Ti electrode pad, which is formed by sequentially stacking, for example, titanium and aluminum on the first n-type AlC layer 21. It should be understood that the electrodes of the semiconductor device according to this embodiment are not limited thereto.

(Fabrication Method)

A method of fabricating the semiconductor device 100 will be described. In fabrication of the semiconductor device 1000, for example, a 1 um thick first n-type AlC layer 21, a 10 nm thick first AlN layer 30, a 10 nm thick GaN layer 10, a 10 nm thick second AlN layer 30, and a 1 um thick second p-type AlC layer 23 may be formed on the substrate 1. Since the process of forming the laminate substrate 300 is described in Embodiment 3, a detailed description thereof will be omitted herein. Additionally, in this embodiment, silicon is doped into the first AlC layer 21 and zinc or magnesium is doped into the second AlC layer 23. Any known technique may be used for doping in this embodiment.

Each of the second AlC layer 20, second AlN layer 30, GaN layer 10 and second AlN layer 30 is partially removed from the prepared laminate substrate 300. In addition, some region of the second p-type AlC layer 23 is planarized. This process may be carried out by reactive ion etching (RIE) using, for example, boron trichloride ($BCl_3$). Then, for example, a 10 nm thick titanium layer and a 10 nm thick aluminum layer may be sequentially stacked on the planarized region of the second p-type AlC layer 23 to form the N-electrode 93. Further, for example, a 10 nm thick nickel layer and a 10 nm thick gold layer may be sequentially stacked on the second AlC layer 20 to form the P-electrode 91.

As described above, although a non-crystalline AlC thin film has been reported in the art, the semiconductor device may have a crystalline AlC layer 20 fromed by the method described above. Further, in the semiconductor device, an AlN layer is formed between the AlC layer and the GaN layer, thereby preventing diffusion of carbon into the GaN layer. Accordingly, it is possible to realize a laminate substrate having characteristics of the AlC layer described above. Further, when used in an LED, the semiconductor device according to this embodiment exhibits light extraction in the wavelength band of 300~350 nm.

Embodiment 6

In this embodiment, the laminate substrate 400 is applied to a semiconductor device, particularly, to an LED.

Figure 6:
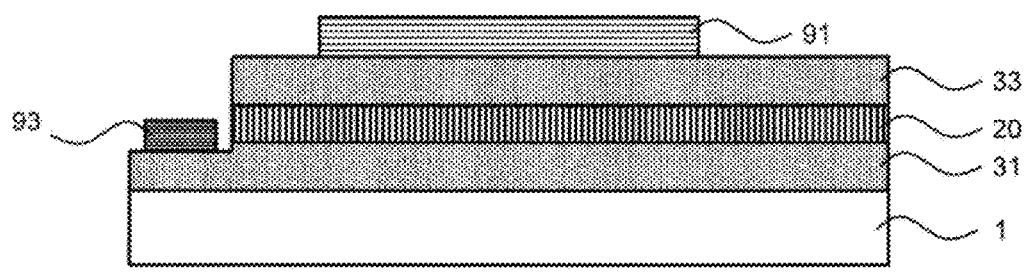
FIG. 6 is a view of a semiconductor device 2000 in accordance with another exemplary embodiment of the invention.

FIG. 6 is a view of a semiconductor device 2000 in accordance with one exemplary embodiment of the invention. The semiconductor device 2000 has a laminate substrate, which is formed by sequentially stacking a substrate 1, an n-type crystalline AlN layer 31, a crystalline AlC active layer 20, and a p-type crystalline AlN layer 33. Further, the semiconductor device 2000 includes a P-electrode 91 and an N-electrode 93, in which the P-electrode 91 is located on an upper surface of the second AlN layer 33 and the N-electrode 93 is located on an upper surface of the first AlN layer 31.

In the semiconductor device 2000, for example, silicon (Si) is doped into the first AlN layer 31 formed on the substrate 1, and, for example, magnesium (Mg) is doped into the second AlN layer 33 formed on the AlC layer 20. As a result, the first AlN layer 31 may act as an n-type semiconductor and the second AlN layer 33 may act as a p-type semiconductor. In addition, since the semiconductor device 2000 includes the laminate substrate 400 of Embodiment 4, the configuration and characteristics of the laminate substrate for this embodiment will be omitted herein.

(Electrode)

The electrodes of the semiconductor device will now be described. In this embodiment, the P-electrode 91 may be an Au/Ni electrode pad, which is formed by sequentially stacking, for example, nickel and gold on the second AlN layer 33. Further, the N-electrode 93 may be an Al/Ti electrode pad, which is formed by sequentially stacking, for example, titanium and aluminum on the first AlN layer 31. It should be understood that the electrodes of the semiconductor device according to this embodiment are not limited thereto.

(Fabrication Method)

In fabrication of the semiconductor device 2000, since the process of forming the laminate substrate 400 is described in Embodiment 4, a detailed description thereof will be omitted herein. Each of the second AlN layer 33 and the AlC layer 20 is partially removed from the prepared laminate substrate 400. In addition, some region of the first AlN layer 31 is planarized. This process may be carried out by reactive ion etching (RIE) using, for example, boron trichloride ($BCl_3$). Then, for example, a 10 nm thick titanium layer and a 10 nm thick aluminum layer may be sequentially stacked on the planarized region of the first AlN layer 31 to form the N-electrode 93. Further, for example, a 10 nm nickel layer and a 10 nm thick gold layer may be sequentially stacked on the second AlN layer 33 to form the P-electrode 91.

As described above, although only a non-crystalline AlC thin film has been reported in the art, the laminate substrate 400 may have a crystalline AlC layer 20 having the properties as described in Embodiment 1. Further, when used in an LED, the laminate substrate 400 including the AlC layer 20 formed between the first AlN layer 31 acting as an n-type semiconductor and the second AlN layer 33 acting as a p-type semiconductor exhibits light extraction in the wavelength band of around 310 nm.

EXAMPLE

Figure 7:
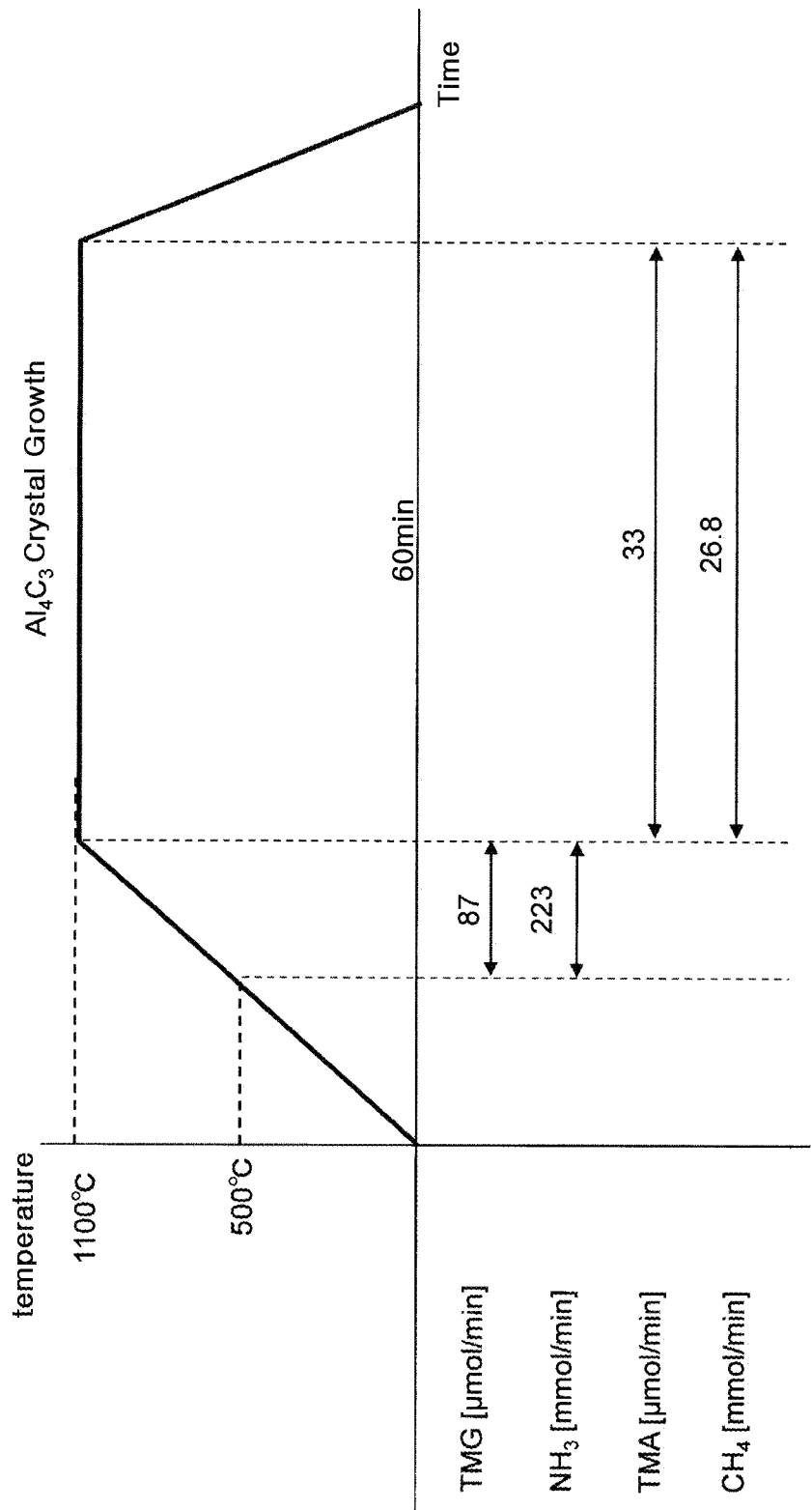
FIG. 7 is a graph depicting conditions for fabricating the laminate substrate 100 in accordance with the exemplary embodiment of the invention.

Hereinafter, examples of an aluminum carbide layer and a semiconductor substrate having the aluminum carbide layer formed thereon according to the invention will be described. As an example, the laminate substrate 100 of Embodiment 1 was prepared. FIG. 7 is a graph depicting conditions for fabricating the laminate substrate 100 in accordance with an exemplary embodiment of the invention.

(Fabrication Method)

In this example, a 0.5 um thick GaN layer 10 was formed on a substrate 1, followed by forming an AlC layer 20 on the GaN layer 10. Here, the GaN layer 10 was formed using MOCVD by supplying TMG at 44 μmol/min and ammonia at 223 mmol/min to the fabrication atmosphere for 15 minutes to grow GaN crystals on the substrate 1.

Then, as shown in FIG. 7, in this example, TMG and ammonia were supplied to the fabrication atmosphere at 500° C. or more. Here, as an example, TMG was supplied at 87 μmol/min and ammonia was supplied at 223 mmol/min. TMG and ammonia were supplied to the fabrication atmosphere until the temperature of the fabrication atmosphere reached the growth temperature of the AlC crystals, that is, 1100° C. When the temperature of the fabrication atmosphere reached 1100° C., supply of TMG and ammonia was stopped, and TMA and methane were supplied to the fabrication atmosphere. AlC crystals were grown at 1100° C. for 60 minutes to form the AlC layer 20. Here, as an example, TMA was supplied at 33 μmol/min and methane was supplied at 26.8 mmol/min to the fabrication atmosphere. As a result, a 1 um thick AlC layer 20 was formed.

(SEM Image)

FIG. 8 is SEM images of the laminate substrate 100 in accordance with the exemplary embodiment of the invention. In FIG. 8, (a) shows an upper surface of the AlC layer 20 of the laminate substrate 100, (b) is an enlarged view of a portion of (a), and (c) is a perspective view of the laminate substrate 100. For the laminate substrate 100, it was observed that the AlC layer 20 was formed on the upper surface of the substrate.

(XRD Analysis)

The AlC layer 20 of the laminate substrate 100 formed as described above was analyzed using an XRD in 2θ-ω mode. In this example, X'pert MRD (Philips Co., Ltd.) was used as the XRD apparatus. CuKα and CuKβ were used as incident X-rays. FIG. 9 shows XRD measurement results. In FIG. 9, the laminate substrate 100 of this example was compared with a substrate having a GaN layer 10, which was formed using a sapphire substrate as the substrate 1. The peaks caused by sapphire used as the substrate 1 were observed near 38° and 42°. The peaks caused by the GaN layer 10 were detected near 31° and 35°. The peak caused by the $Al_4C_3$ crystals of the AlC layer 10 was detected near 35°.

As such, the embodiments of the invention provide a crystalline aluminum carbide layer, a semiconductor substrate having the crystalline aluminum carbide layer formed thereon, and a method of fabricating the same.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A laminate substrate comprising:
   a GaN layer comprising a GaN crystal; and
   an AlC layer comprising an AlC crystal.

2. The laminate substrate of claim 1, further comprising an AlN layer comprising an AlN crystal.

3. The laminate substrate of claim 2, wherein the GaN layer and the AlC layer face each other with the AlN layer interposed therebetween.

4. The laminate substrate of claim 1, wherein the GaN layer, the AlC layer, or the AlN layer is disposed on a sapphire substrate, a silicon carbide substrate, or an AlN substrate.

5. The laminate substrate of claim 3, wherein the GaN layer, the AlC layer, or the AlN layer is disposed on a c-plane of the sapphire substrate.

6. A laminate substrate, comprising:
   a first AlN layer; and
   a second AlN layer,
wherein the first AlN layer and the second AlN layer face each other with an AlC layer interposed therebetween.

7. A method of fabricating a laminate structure comprising a GaN layer comprising a GaN crystal and an AlC layer comprising an AlC crystal, the method comprising:
   supplying a carbon containing gas and an aluminum containing gas to grow the AlC layer.

8. The method of claim 7, further comprising: forming an AlN layer comprising an AlN crystal.

9. The method of claim 8, wherein the GaN layer, the AlC layer, or the AlN layer is formed on a sapphire substrate, a silicon carbide substrate, or an AlN substrate.

10. The method of claim 9, wherein the AlC crystal is grown on a c-plane of the sapphire substrate.

11. The method of claim 7, wherein the AlC crystal is grown to form the AlC layer using a metal organic chemical vapor deposition.

12. The method of claim 7, wherein the carbon containing gas comprises methane and the aluminum containing gas comprises tri-methyl aluminum.

13. The method of claim 12, wherein the tri-methyl aluminum is supplied at a flow rate of 33 μmol/min to 66 μmol/min and the methane is supplied at a flow rate of 13 mmol/min to 27 mmol/min to grow the AlC crystal.

14. The method of claim 13, wherein the AlC crystal is grown at a temperature of at least 700° C.

15. The method of claim 13, wherein the AlC crystal is grown at a temperature of at least 1000° C.

16. A method of fabricating a laminate substrate comprising an AlN layer comprising an AlN crystal and an AlC layer comprising an AlC crystal, the method comprising:
supplying a carbon containing gas and an aluminum containing gas to grow the AlC layer.

* * * * *